(12) United States Patent
Lee

(10) Patent No.: US 10,244,669 B2
(45) Date of Patent: Mar. 26, 2019

(54) DISPLAY SYSTEM

(71) Applicant: KEYSER INDUSTRIES, INC., Evergreen Park, IL (US)

(72) Inventor: Nick Lee, Huntersville, NC (US)

(*) Notice: Subject to any disclaimer, the term of this patent is extended or adjusted under 35 U.S.C. 154(b) by 0 days.

(21) Appl. No.: 15/673,193

(22) Filed: Aug. 9, 2017

(65) Prior Publication Data
US 2018/0049350 A1    Feb. 15, 2018

Related U.S. Application Data

(60) Provisional application No. 62/373,079, filed on Aug. 10, 2016.

(51) Int. Cl.
| | | |
|---|---|---|
| *H05K 7/20* | (2006.01) | |
| *G02F 1/1333* | (2006.01) | |
| *H02B 1/28* | (2006.01) | |
| *G09F 19/22* | (2006.01) | |

(52) U.S. Cl.
CPC ... *H05K 7/20972* (2013.01); *G02F 1/133308* (2013.01); *G02F 1/133385* (2013.01); *G09F 19/22* (2013.01); *H02B 1/28* (2013.01); *H05K 7/20209* (2013.01); *G02F 2001/133311* (2013.01)

(58) Field of Classification Search
CPC .. H05K 7/20; H05K 7/20972; H05K 7/20209; H05K 7/20954; H05K 7/20136; H05K 7/20145; H02B 1/28; G02F 1/133308; G02F 1/133385; G02F 2201/36; G02F 2001/133311; G09F 19/22; G09F 9/35
USPC .......... 361/695, 679.02, 696, 694; 312/223.2
See application file for complete search history.

(56) References Cited

U.S. PATENT DOCUMENTS

| | | | | |
|---|---|---|---|---|
| 6,226,165 B1* | 5/2001 | Collins | ............... | E05B 73/0082 361/1 |
| 6,366,452 B1* | 4/2002 | Wang | ..................... | F16M 11/10 248/125.1 |
| 2007/0097609 A1* | 5/2007 | Moscovitch | ........... | F16M 11/04 361/679.04 |
| 2011/0075363 A1* | 3/2011 | Nakamichi | ............... | G09F 9/35 361/696 |
| 2012/0223877 A1* | 9/2012 | Cho | .................. | G02F 1/133385 345/102 |
| 2013/0241485 A1* | 9/2013 | Snyder | ................ | B60L 11/1809 320/109 |
| 2015/0137670 A1* | 5/2015 | Chikkakalbalu | ...... | A47F 3/0482 312/116 |

(Continued)

*Primary Examiner* — Mandeep S Buttar
(74) *Attorney, Agent, or Firm* — Ladas & Parry LLP; David C Brezina

(57) ABSTRACT

A display system including an upright housing meeting IP56 weatherproofing standards and including a first vent and a second vent positioned vertically above the first vent, a mounting arm coupled to the upright housing, an industrial PC mounted within the upright housing between the first vent and the second vent, a fan mounted within the upright housing adjacent the first vent, a thermostat mounted within the upright housing and controlling the fan continuously at or above a non-zero minimum speed so that a positive pressure is maintained within the upright housing between the first vent and the second vent, and a large format display mounted to the mounting arm and receiving signals from the industrial PC.

17 Claims, 16 Drawing Sheets

(56) References Cited

U.S. PATENT DOCUMENTS

2016/0102645 A1* 4/2016 Henley .................. F02N 19/02
                                                    219/205
2016/0324040 A1* 11/2016 Bouissiere ......... H05K 7/20972
2017/0018952 A1* 1/2017 Finckh ................. G06F 1/1601
2017/0008305 A1   3/2017 Simpson
2018/0041731 A1* 2/2018 Yu ......................... G08C 17/02

* cited by examiner

US 10,244,669 B2

DISPLAY SYSTEM

CROSS-REFERENCE TO RELATED PATENT APPLICATIONS

This application claims the benefit of U.S. Application No. 62/373,079, filed Aug. 10, 2016, which is incorporated herein by reference in its entirety.

BACKGROUND

The present invention relates generally to display systems. More specifically, the present invention relates to display systems for use outside.

SUMMARY

One embodiment a display system includes a support system, a large format display supported by the support system, and a control system housed within the support system. In one embodiment, the support system is a column that may be arranged to support the large format display. In some embodiments, the display system includes a second large format display. In some embodiments, the column is arranged to support one or two large format displays. In some embodiments, the control system includes fans mounted within the support system. In some embodiments, the fans run substantially continuously. In one embodiment, the support system meets IP56 weatherproofing standards.

In some embodiments, a display system includes an upright housing meeting IP56 weatherproofing standards and including a first vent and a second vent positioned vertically above the first vent, a mounting arm coupled to the upright housing, an industrial PC mounted within the upright housing between the first vent and the second vent, a fan mounted within the upright housing adjacent the first vent, a thermostat mounted within the upright housing and controlling the fan continuously at or above a non-zero minimum speed so that a positive pressure is maintained within the upright housing between the first vent and the second vent, and a large format display mounted to the mounting arm and receiving signals from the industrial PC.

In some embodiments, a display system includes an upright housing meeting IP56 weatherproofing standards and including a vent, a mounting arm coupled to the upright housing, a controller mounted within the upright housing above the vent, a continuously operational fan mounted within the upright housing adjacent the vent, and a large format display mounted to the mounting arm and receiving signals from the controller.

In some embodiments, a display system includes a housing configured to support one or more large format displays, a controller mounted within the housing and configured to send display signals to the one or more large format displays, and a fan mounted within the housing and positioned vertically below the controller, the fan operating continuously at or above a non-zero minimum speed to maintain a positive pressure within the housing.

Alternative exemplary embodiments relate to other features and combinations of features as may be generally recited in the claims.

BRIEF DESCRIPTION OF THE FIGURES

The disclosure may be more fully understood in view of the following detailed description and figures.

DETAILED DESCRIPTION

Figure 3:
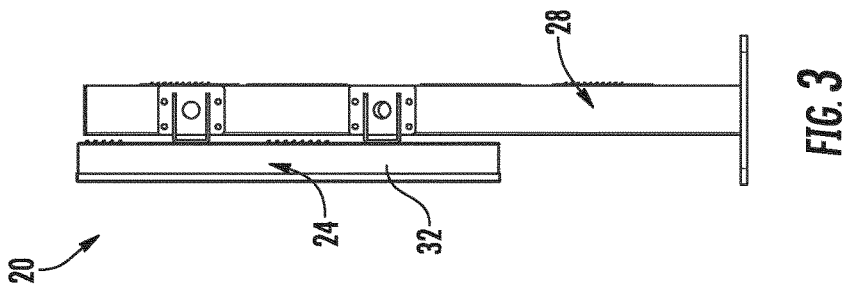
FIG. 3 is a right side view of the display system of FIG. 1.
Figure 2:
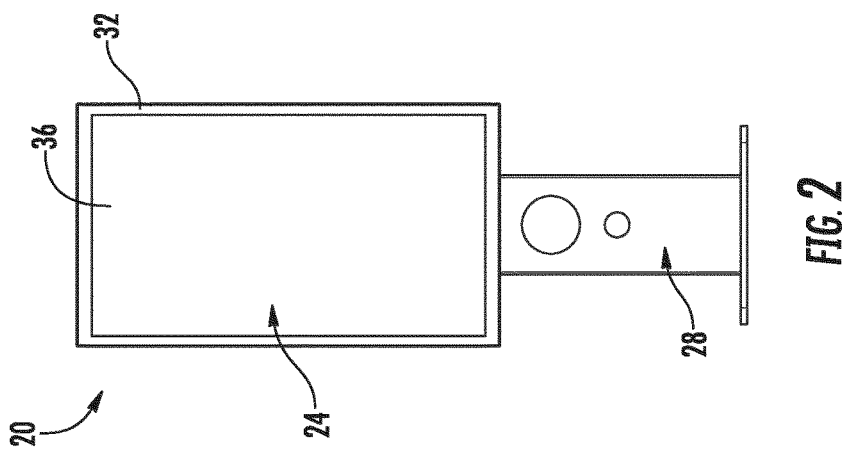
FIG. 2 is a front view of the display system of FIG. 1.
Figure 1:
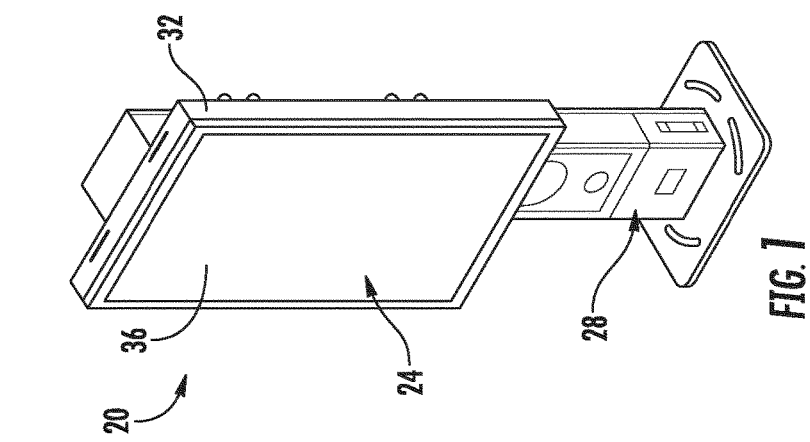
FIG. 1 is a pictorial view of a display system according to one embodiment.
Figure 4:
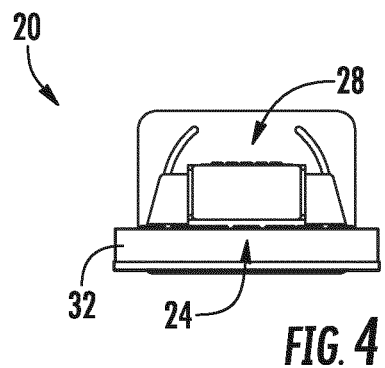
FIG. 4 is a top view of the display system of FIG. 1.
Figure 5:
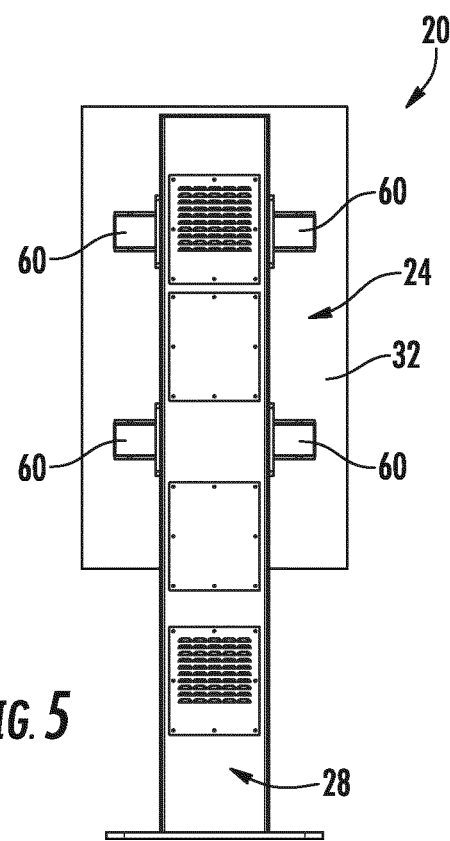
FIG. 5 is a back view of the display system of FIG. 1.
Figure 7:
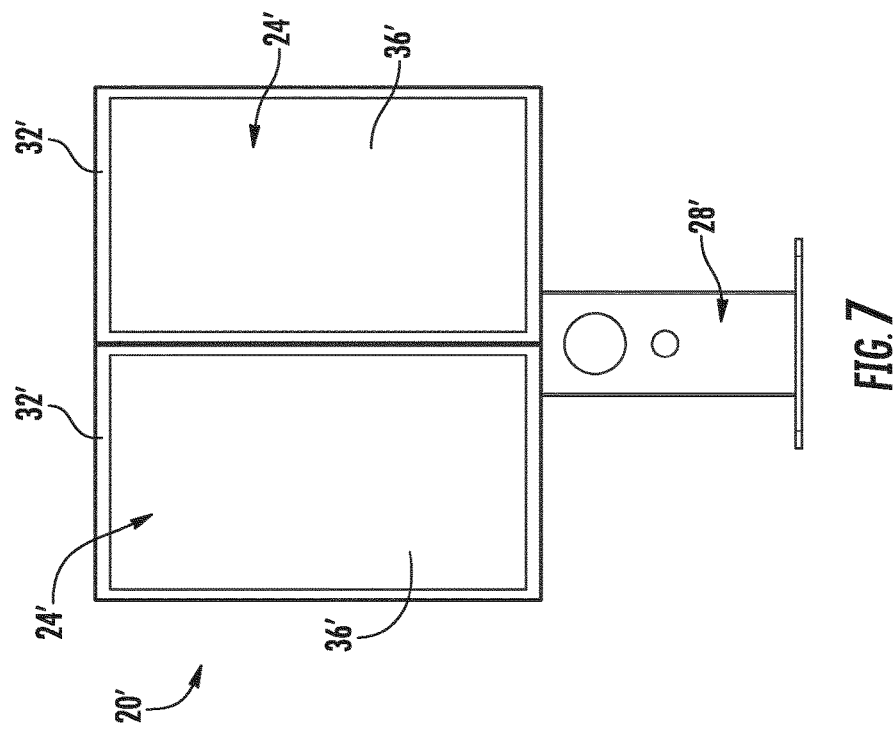
FIG. 7 is a front view of the display system of FIG. 6.
Figure 6:
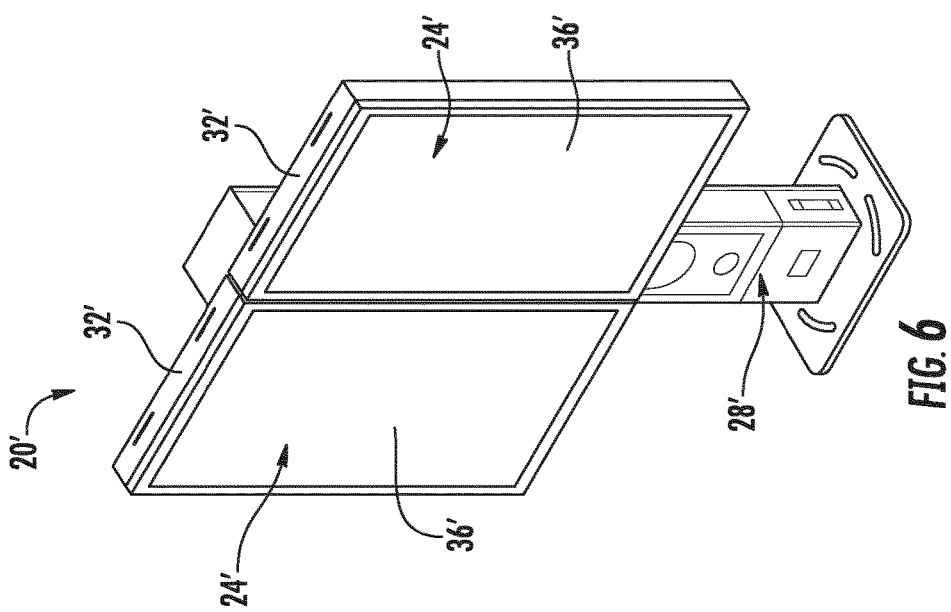
FIG. 6 is a pictorial view of another display system according to one embodiment.
Figure 8:
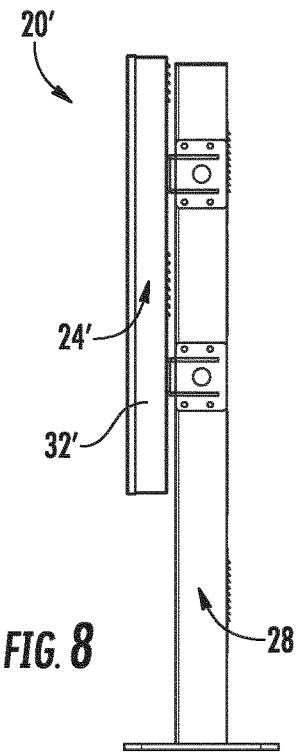
FIG. 8 is a right side view of the display system of FIG. 6.
Figure 9:
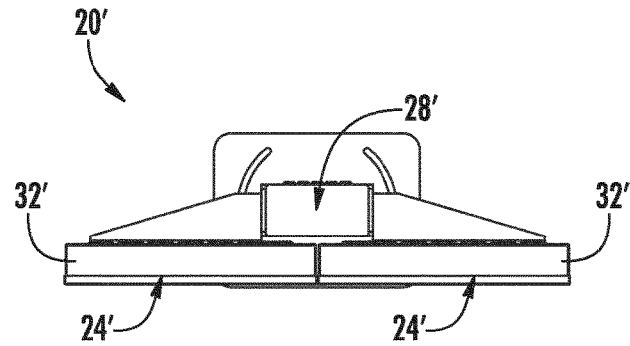
FIG. 9 is a top view of the display system of FIG. 6.
Figure 10:
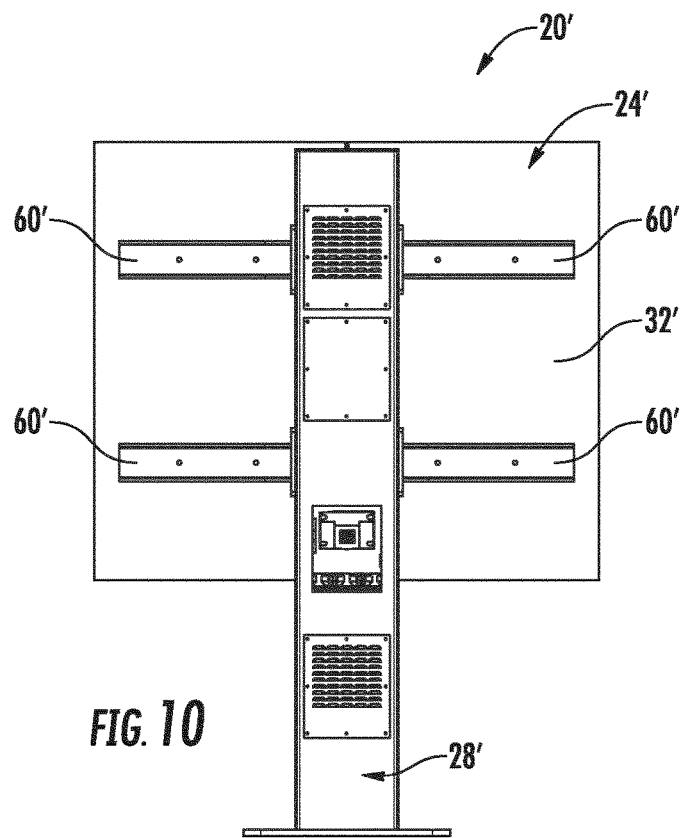
FIG. 10 is a back view of the display system of FIG. 6.
Figure 12:
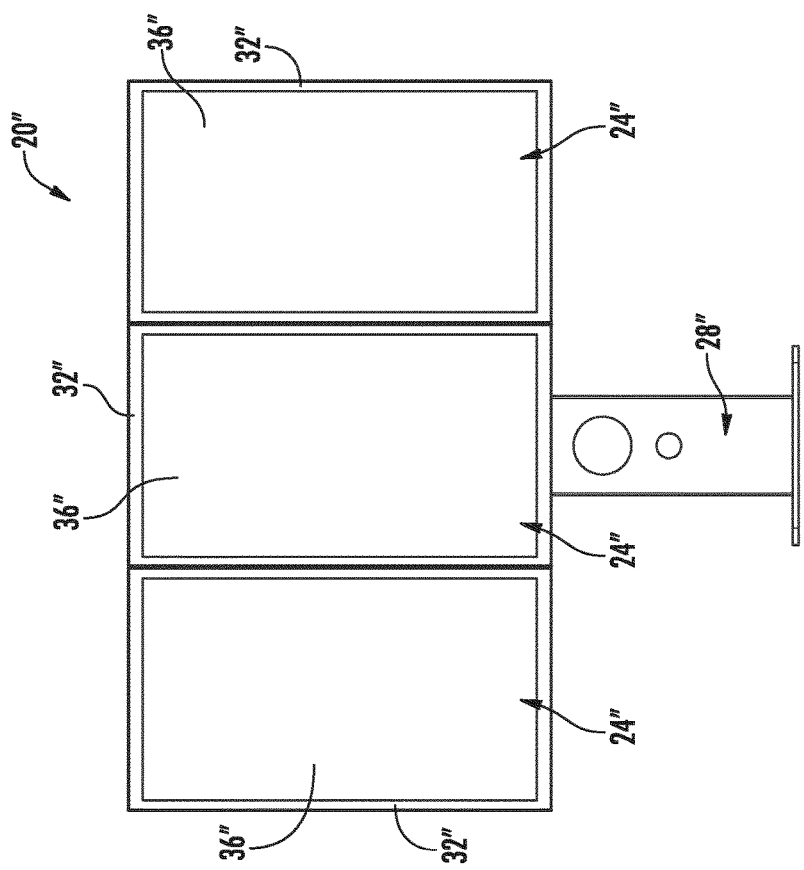
FIG. 12 is a front view of the display system of FIG. 11.
Figure 11:
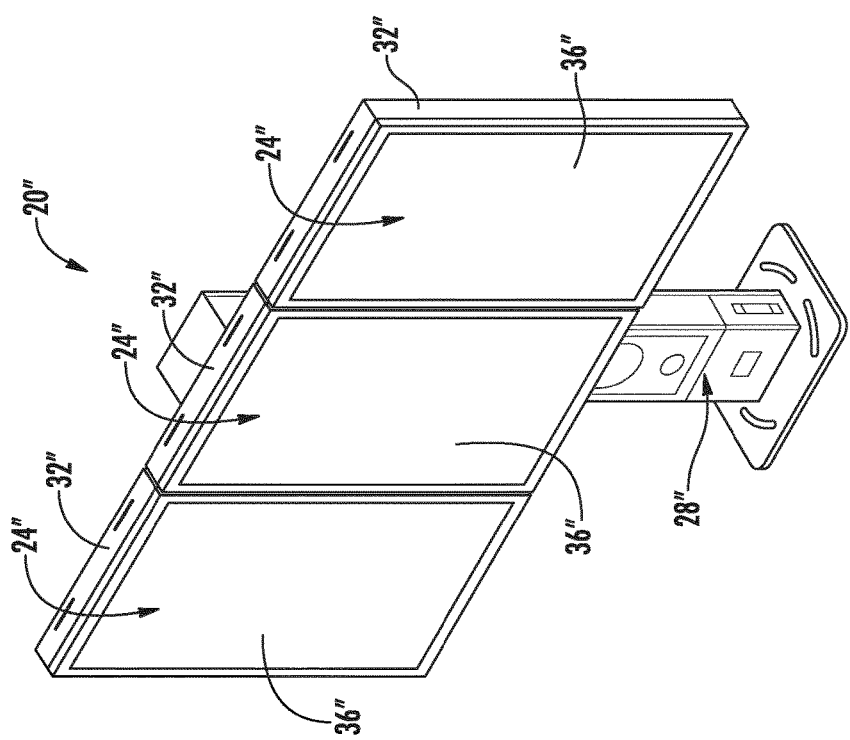
FIG. 11 is a pictorial view of another display system according to one embodiment.
Figure 13:
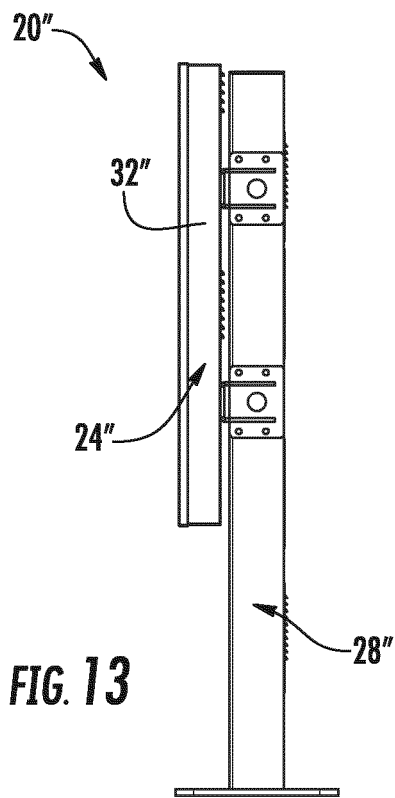
FIG. 13 is a right side view of the display system of FIG. 11.
Figure 14:
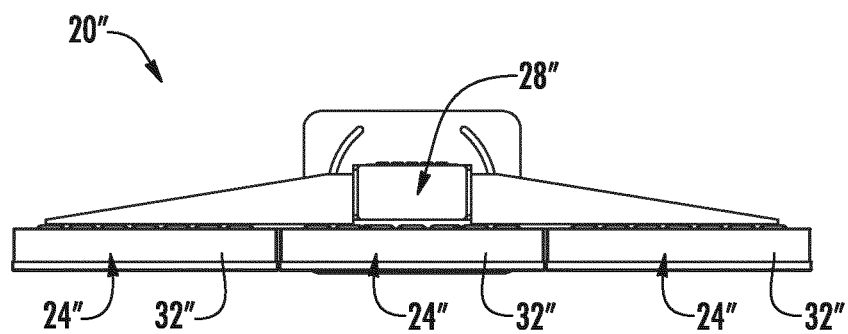
FIG. 14 is a top view of the display system of FIG. 11.
Figure 15:
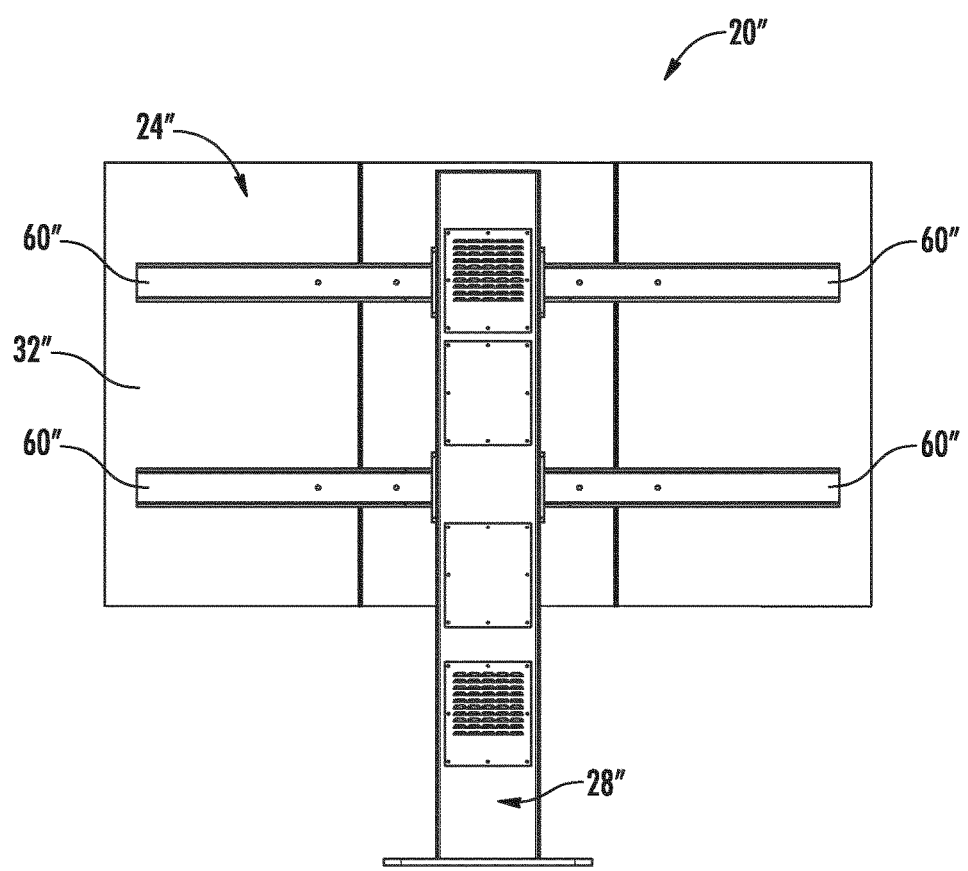
FIG. 15 is a back view of the display system of FIG. 11.

Before turning to the figures, which illustrate the exemplary embodiments in detail, it should be understood that the present application is not limited to the details or methodology set forth in the description or illustrated in the figures. It should also be understood that the terminology is for the purpose of description only and should not be regarded as limiting.

Display systems are used in many situations and locations to provide information to the public or individuals. Display systems may include a programmable screen that can display video, static images, or a combination of video and static images. Display systems may be used as menu boards at quick service restaurants to provide customers with menu items or other information. In other situations, display systems may be used to display advertisements, public messages, or other information (e.g., to display a map of a train station, airport, mall, or other location, to display a directory at a hotel, movie theater, or other location, to display advertising in place of or in addition to the map or the directory).

Display systems include a screen in the form of a large format display, a support system, and a controller. Embodiments discussed below describe a display system that provides a support system that houses the controller and provides a weatherproof enclosure that meets IP56 standards.

As shown in FIGS. 1-5, a display system in the form of a 1×1 display system 20 that includes a large format display 24, and a support system in the form of a column 28. The large format display 24 includes a housing 32 that surrounds and encloses an LED board 36. The housing 32 is configured to provide an IP56 weatherproof rating and a communication port for communication with an outside control or video system. The LED board 36 may be a Panasonic® OMD or OHD display. In other embodiments, another brand or type of display board may be used. For example, LCD displays, plasma displays, or another display type may be used, and displays produced by other manufacturers may be used (e.g., LG®).

As shown in FIGS. 6-10, another display system in the form of a 1×2 display system 20' includes similar parts to the 1×1 display system 20 and like parts are numbered in the prime series. The 1×2 display system 20' include two large format displays 24' and a column 28'.

As shown in FIGS. 11-15, another display system in the form of a 1×3 display system 20" includes similar parts to the 1×1 display system 20 and like parts are numbered in the double prime series. The 1×3 display system 20" include three large format displays 24" and a column 28".

The display systems shown above all provide sealed large format displays that meet IP56 weatherproofing standards, and columns that also meets IP56 weatherproofing standards. The columns are arranged so that the same column can be used to support a number of different large format displays or a number of different large format display layouts. For example, in the above examples, the columns 28, 28' and 28" may be the same column that is arranged to support the three different layouts.

Figure 16:
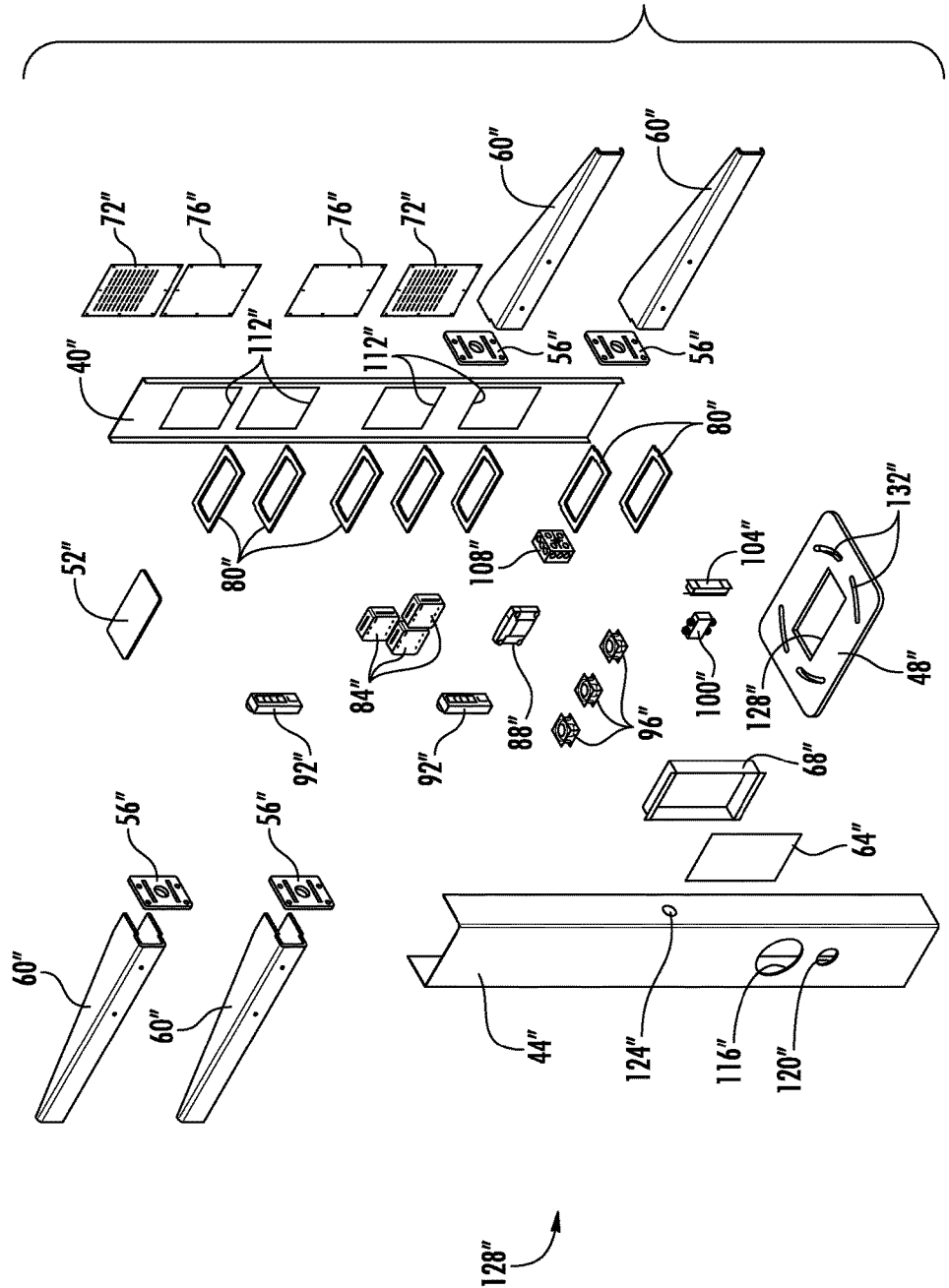
FIG. 16 is an exploded view of the display system of FIG. 1.

FIG. 16 shows the column 28" that is arranged to support three large format displays 24", and includes a main upright back 40", a main upright front 44", a base plate 48", a top cap 52", four mounting arm plates 56", four mounting arms 60", a speaker grill 64", a speaker 68", two vents 72", two cover plates 76", seven gusset plates 80", three industrial PCs 84", a network switch 88", a surge protector outlet strip 92", three cooling fans 96", a main circuit connection 100", a power supply 104", and a junction box 108".

In some embodiments, the main upright back 40" and main upright front 44" may be formed as a single piece, may be shaped differently, or may include different features, as desired. In the embodiment shown in FIG. 16, the main upright back 40" includes four vent apertures 112", and the main upright front 44" includes a communication interface in the form of a speaker aperture 116" and a microphone aperture 120". In other embodiments, the communication interface is shaped differently, include different aperture sizes, or is arranged to interact with other communication devices. For example, a keyboard, keypad, touch screen, card reader, RFID reader, joystick, or another interaction device may be used and the main upright back 40" or the main upright front 44" is arranged to support the chosen communication device. In one embodiment, a seal is provided between the main upright back 40" and the main upright front 44". The main upright front 44" also includes a communication port 124" that is positioned to provide communication with the larger format displays 24".

The base plate 48" provides an upright aperture 128" that is sized to receive the main upright back 40" and the main upright front 44". In the illustrated embodiment, the upright aperture 128" is arranged to be welded to the main upright back 40" and the main upright front 44". The upright aperture 128" may include a fillet or other features to increase the quality or ease of installation during welding. In other embodiments, the upright aperture 128" is arranged to engage the main upright back 40" and the main upright front 44" with fasteners or another way or coupling the main upright back 40" and the main upright front 44" to the base plate 48". The base plate 48" also includes anchor points 132" that are arranged to anchor the display system 20" to a surface (e.g., the ground, a concrete slab, a floor, a wall, a ceiling, etc.). In the illustrated embodiment, the anchor points 132" include apertures arranged to receive fasteners.

The top cap 52" is arranged to be welded onto the main upright back 40" and the main upright front 44". In other embodiments, the top cap 52" may be fastened to the main upright back 40" and the main upright front 44" and provide a seal.

The four mounting arm plates 56" are fastened to the main upright back 40" and the main upright front 44" either with fasteners, welding, or another coupling mechanism. In some embodiments, less than four or more than four mounting arm plates 56" may be provided. The four mounting arm plates 56" are arranged to support the four mounting arms 60".

The mounting arms 60" are sized to support three larger format displays 24". In other embodiments, the mounting arms are arranged to support a single large format display (e.g., the mounting arms 60 shown in FIG. 5), two large format displays (e.g., the mounting arms 60' shown in FIG. 10), or another layout as desired. While four mounting arms 60" are shown, they may collectively be referred to as a single mounting arm that is sized and configured to mount one or more large format displays to an upright housing (e.g., the main upright front 44" and the main upright back 40").

The speaker grill 64" and the speaker box 68" are arranged to engage the speaker aperture 116" and the microphone aperture 120" and provide a speaker and a microphone that a user can interact with. In other embodiments, the speaker grill 64" and the speaker box 68" are replaced by another communication device as discussed above, or eliminated.

The vents 72" engage the vent apertures 112" and provide air flow to an interior of the column 28". The cover plates 76" engage the vent apertures 112" and seal various components within the column 28". In other embodiments, more than two vents 72" or less than two vents 72" may be used. In other embodiments, more than two cover plates 76" or less than two cover plates 76" may be used.

The gusset plates 80" are arranged within the column 28" and modify an airflow within the column 28". Additionally, the gusset plates 80" are arranged to manage humidity flow or fluid flow within the column 28" such that the column 28" meets the IP56 standard.

The three industrial PCs 84" are positioned within the column 28" and each interacts with a single large format display 24" and provides information to be shown on the corresponding larger format display 24". In other embodiments, a single industrial PC 84" may provide display information to more than one large format display 24".

The network switch 88" provides communication between the industrial PCs 84" and an external or remote controller or network. The network switch 88" may provide wired or wireless communication such that the images displayed by the large format displays 24" may be controlled or manipulated.

The a surge protector outlet strip 92" provides power to the various systems within the column 28". In some embodiments, the surge protector outlet strip 92" may be replaced by a power bus, or the components may be individually wired to the power supply, or an external power source (e.g., line power).

The three cooling fans 96" are arranged adjacent the lower most vent plate 72" such that the column 28" is maintained in a generally positive pressure environment. In other words, the pressure within the column 28" is maintained above atmospheric pressure by the fans 96". The gusset plates 80" also aid the column 28" in maintaining a positive pressure environment by providing a partially reduced airflow path. The increased pressure environment reduces the likelihood of humidity and moisture infiltrating the inside of the column 28". In other embodiments, more than three or less than three fans 96" may be used.

The main circuit connection 100" is connected to an external power source such as a main power line (e.g., 110 VAC, 220 VAC) and provides power to the a power supply 104". The main circuit connection 100" is housed in the junction box 108". The power supply 104" receives power from the main circuit connection 100" and converts the main power line to a DC current for use by system components.

Figure 17:
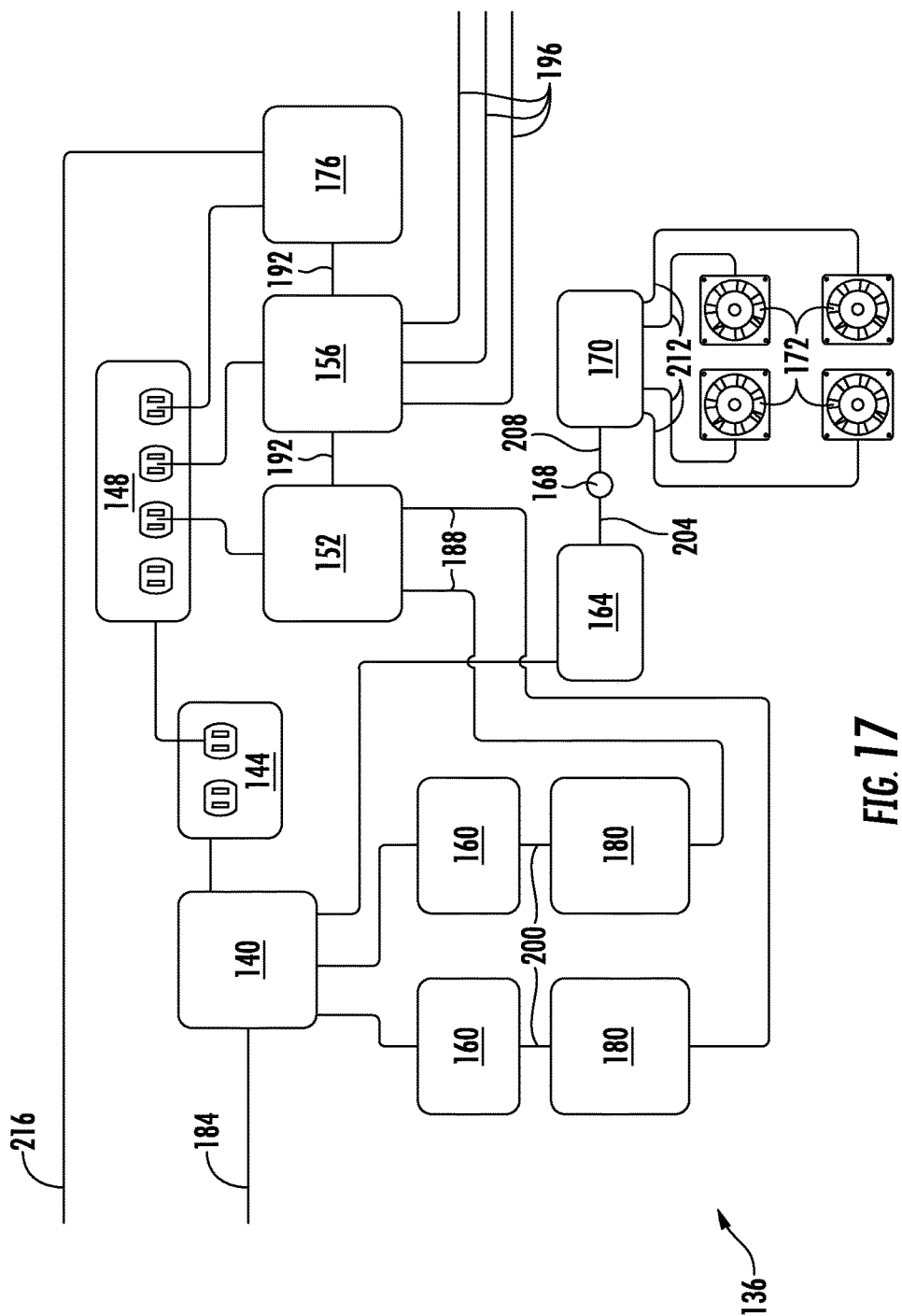
FIG. 17 is a schematic representation of another display system according to one embodiment.
Figure 18:
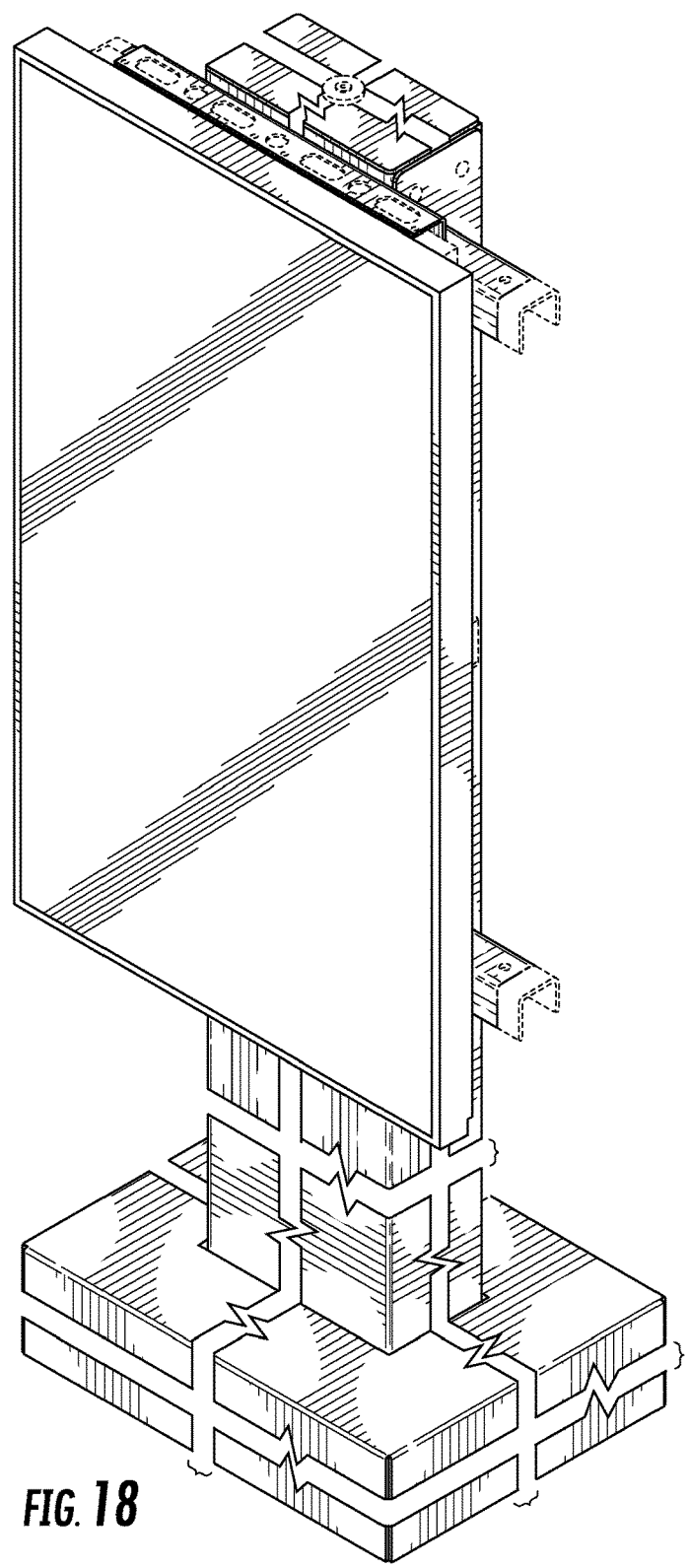
FIG. 18 is a front, right, top, perspective view of an ornamental design for a display system according to one embodiment.
Figure 19:
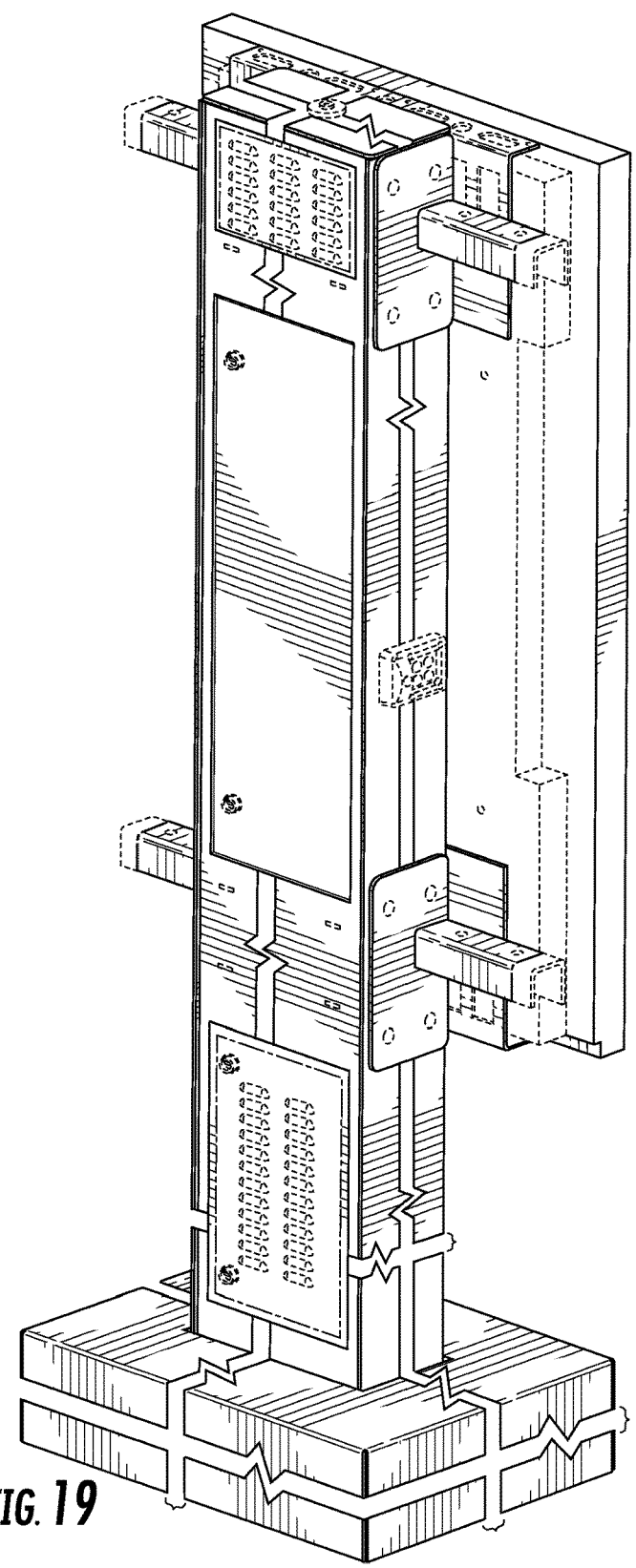
FIG. 19 is a back, left, top perspective view of the display system of FIG. 18.
Figure 20:
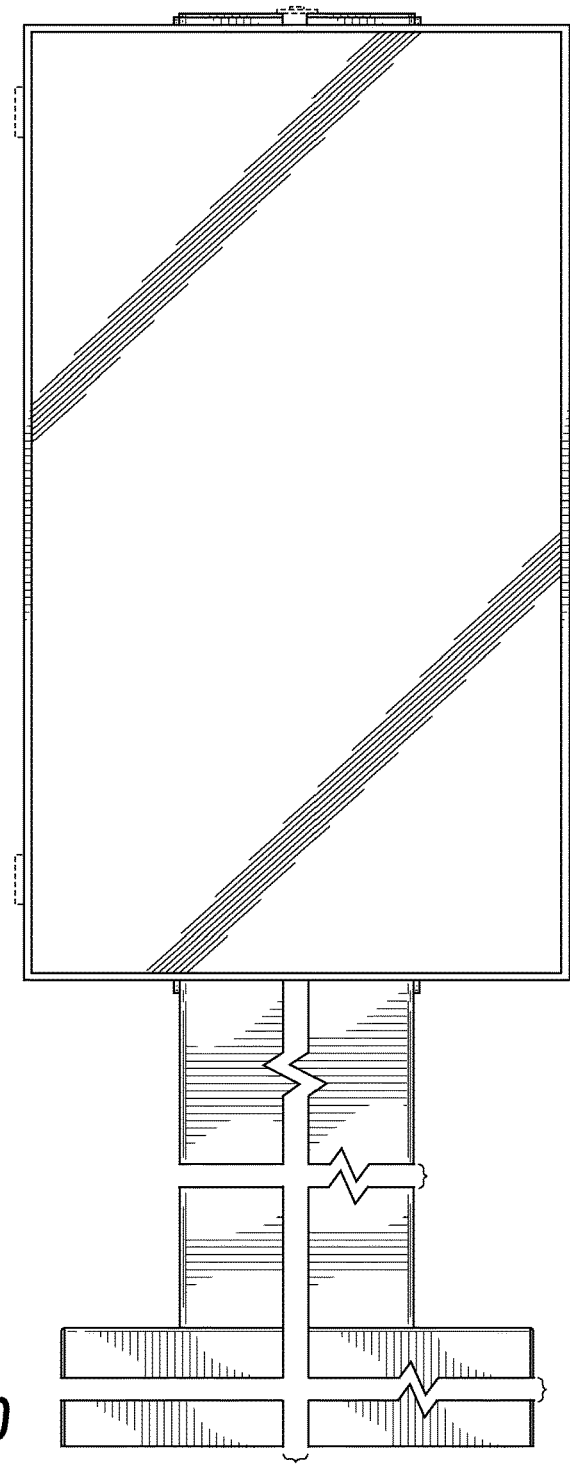
FIG. 20 is a front view of the display system of FIG. 18.
Figure 21:
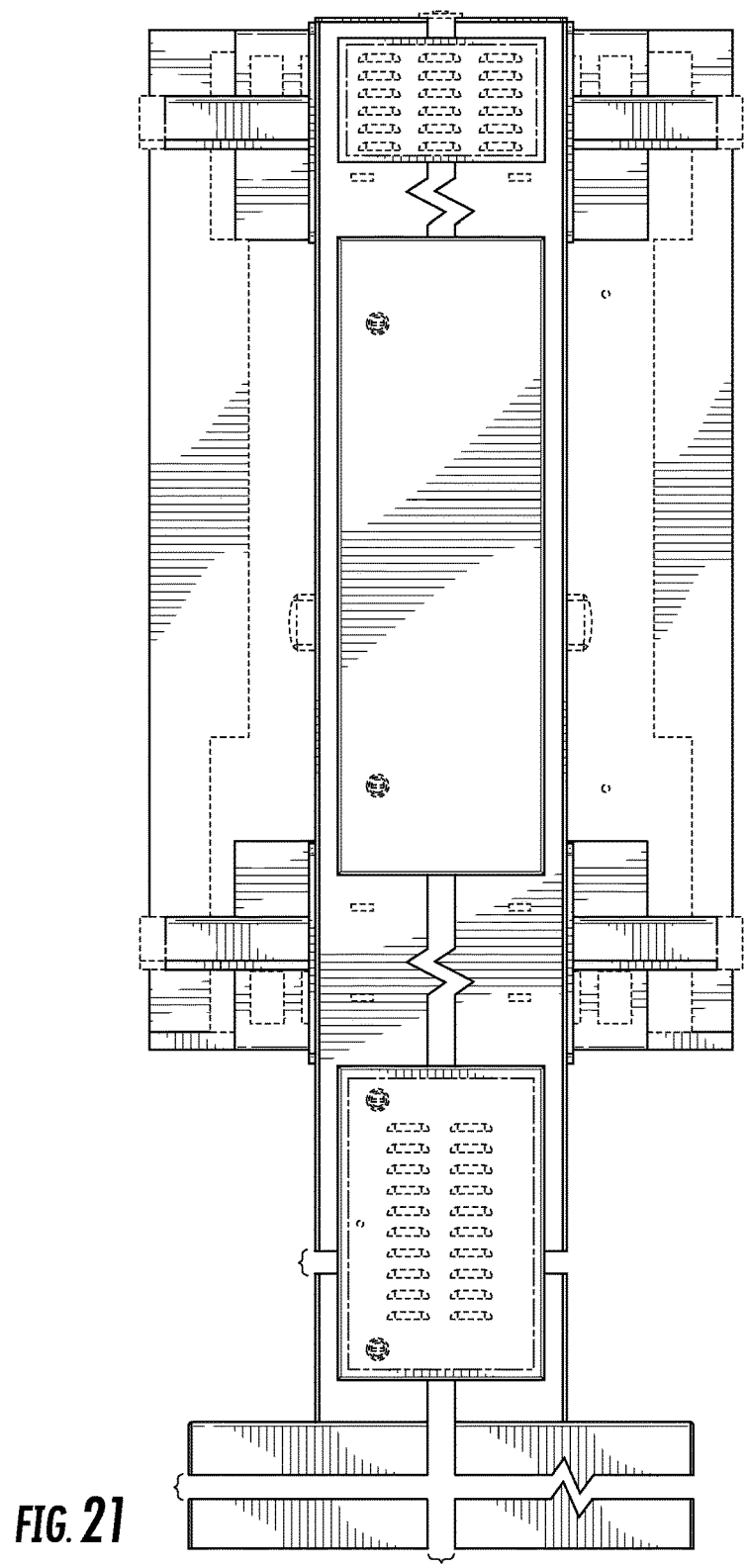
FIG. 21 is a back view of the display system of FIG. 18.
Figure 22:
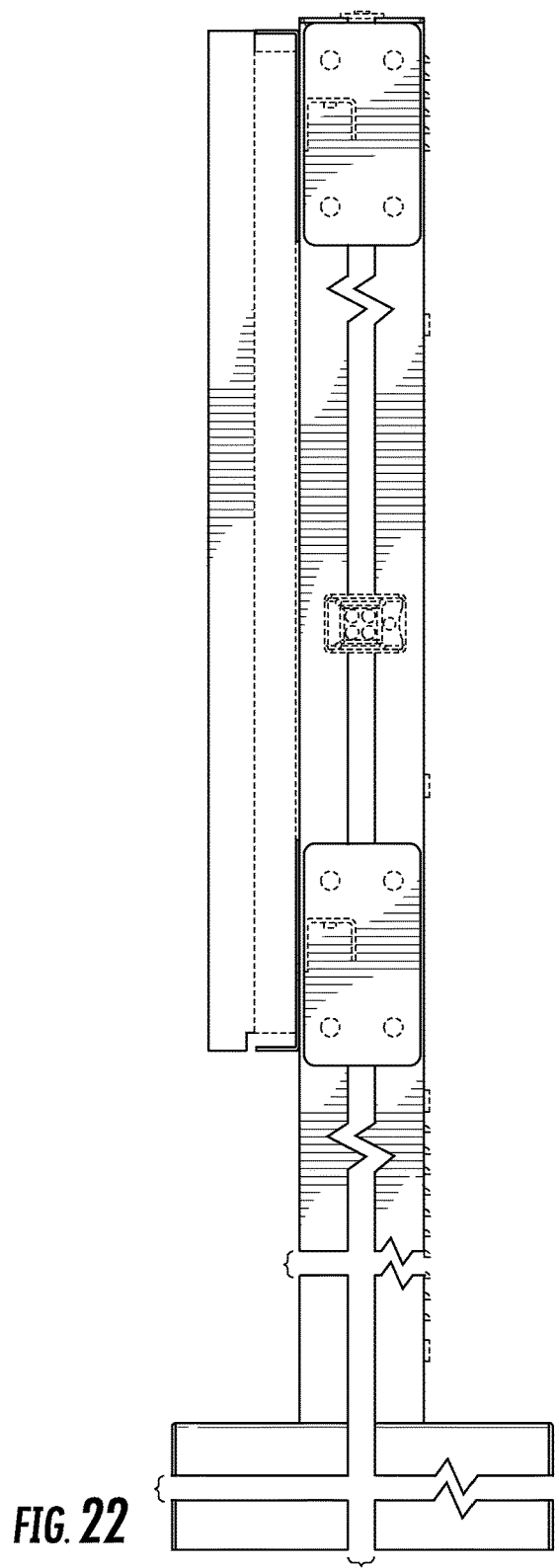
FIG. 22 is a right view of the display system of FIG. 18.
Figure 23:
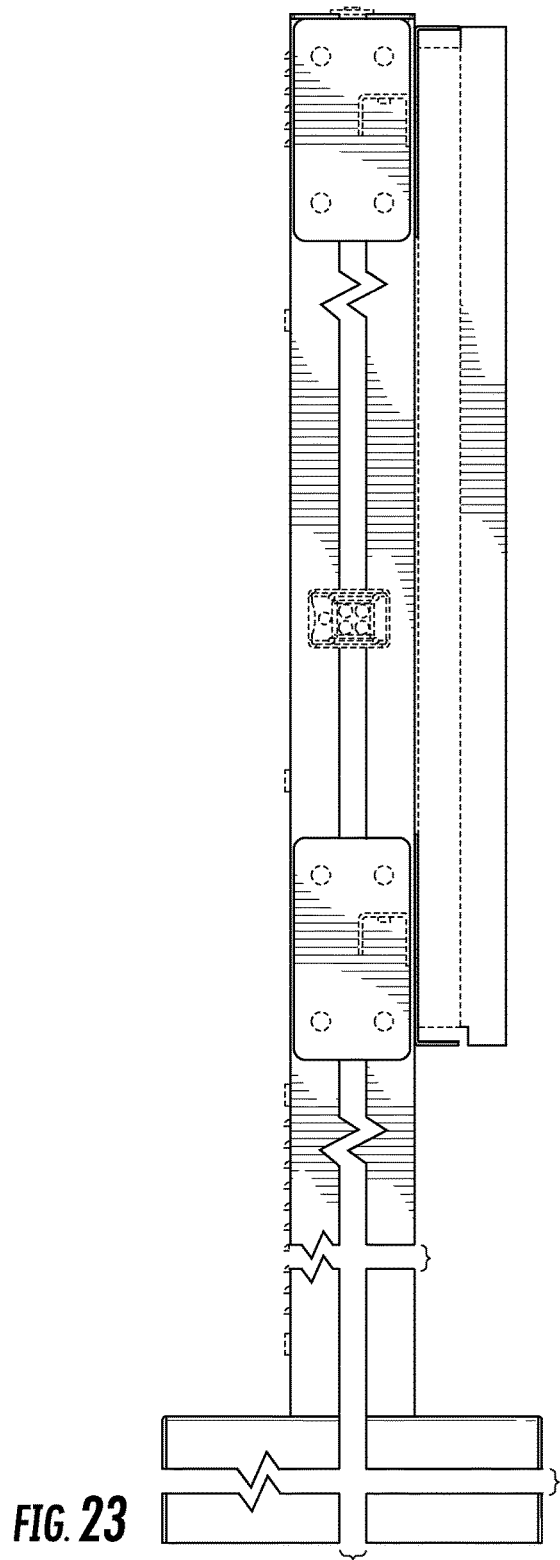
FIG. 23 is a left view of the display system of FIG. 18.
Figure 24:
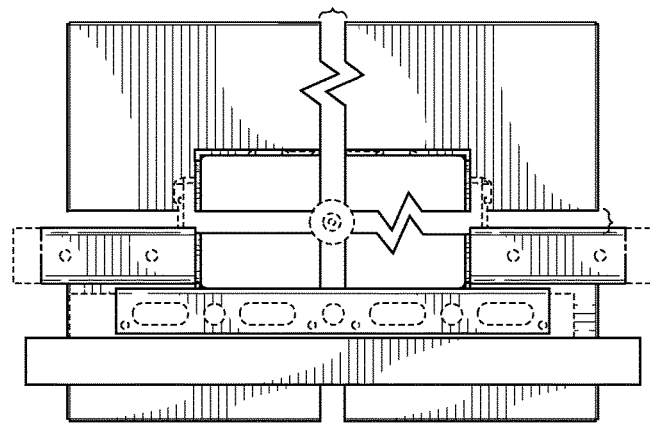
FIG. 24 is a top view of the display system of FIG. 18.
Figure 25:
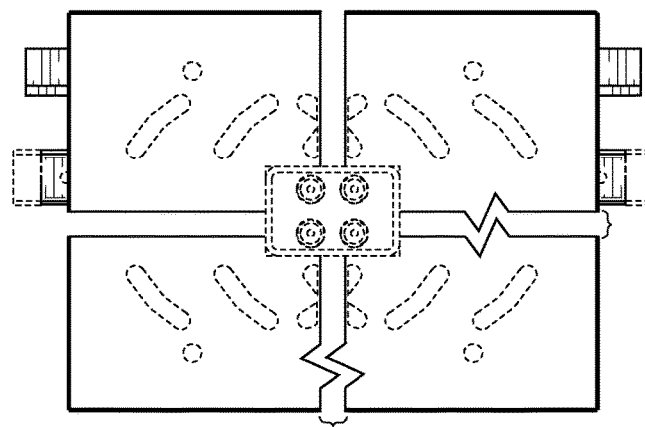
FIG. 25 is a bottom view of the display system of FIG. 18.

An exemplary control circuit 136 is shown in FIG. 17. The control circuit 136 may be used in any of the display systems 20, 20', 20" discussed above and includes a termination box 140, a junction box 144, a power strip 148, a media player 152, a router 156, two monitor power supplies 160, a DC power supply 164, a thermostat 168, a terminal box 170, four fans 172, a fiber converter 176, and two monitors 180. The monitors 180 may be large format displays (e.g., the large format display 24), and the system may be arranged with one or more monitors 180, as desired.

The termination box 140 is arranged to receive external power in the form of line power 184 (e.g., 110 VAC or 220 VAC) and is in electrical communication with the junction box 144, the monitor supplies 160, and the DC power supplies 164. In one embodiment, the termination box is the junction box 108" discussed above.

The junction box 144 may be a 4-plex junction box and provides power to the power strip 148. In one embodiment, the junction box 144 is the main circuit connection 100" discussed above. The power strip 148 distributes line power to the media player 152, the router 156, and the fiber converter 176. In one embodiment, the power strip 148 is the surge protector outlet strip 92" discussed above.

The media player 152 receives power from the power strip 148 and delivers image signals to the monitors 180 via cables in the form of DVI cables 188. In other embodiments, different cable types may be used to transmit signals between the monitors 180 and the media player 152. In one embodiment, the media player 152 includes industrial PCs 84" as discussed above. For example, one media player 152 may be provided for each monitor 180, or the media player 152 may provide signals to more than one monitor 180. In some embodiments, the media player 152 is another type of controller, processor, or computing device, as desired.

The router 156 is in communication with the media player 152 and the fiber converter 176 via cables in the form of CAT5e cables 192. In other embodiments, different cable types may be used to transmit signals between the router 156, the media player 152, and the fiber converter 176. The router 156 is also in communication with a remote network, in the form of a patch panel or and external antenna via cables in the form of DVI cables 196. In other embodiments, different cable types may be used for communication with the router 156.

The monitor power supplies 160 receive power from the termination box 140 and provide conditioned power to the monitors 180 via low voltage wires or cables 200. In some embodiments, the monitor power supplies 160 may be housed within a housing of the monitor 180 (e.g., the housing 32 of the large format display 24). In other embodiments, the monitor power supplies 160 may be housed within a support structure (e.g., the column 28). In some embodiments, each monitor power supply 160 provides power to more than one monitor 180.

The DC power supply 164 receives line power from the termination box 140 and converts the line power to a conditioned DC power that is provided to the thermostat 168 via a low voltage wire or cable 204. The thermostat 168 monitors the temperature of the control circuit 136 and operates the fans 172 to maintain the temperature within a desired temperature range. When the thermostat 168 determines that cooling is needed power is delivered via low voltage wire or cable 208 to the terminal box 170 where the power signal is then distributed via low voltage wires or cables 212 to the fans 172.

The fiber converter 176 receives a fiber optic cable 216 and is configured to interpret signals received from the fiber optic cable 216 and deliver the interpreted signals to the media player 152 so they may be displayed on the monitors 180.

In one embodiment, all components of the control circuit 136 are housed in the column 28 except the monitors 180. The monitor 180 may be the LED board 36, and the low voltage wire or cable 200 and the DVI cables 188 may run between the housing 32 and the column 24 via the communication port 124 in the column 28.

In one embodiment, the thermostat 168 operates the fans 172 such that the fans 172 run substantially continuously. The thermostat 168 may be a pulse width modulated (PWM) thermostat that can control the fans 172 at a number of different speeds. For example, a minimum speed may be maintained at all times, and in times of cooling demand, the thermostat 168 operates the fans 172 at a high speed or any speed higher than the minimum speed as demanded by the level of required cooling. Continuously maintaining the fans 172 at a minimum speed may be especially advantageous in cold climates where snow and ice are an issue and may tend to cause the freezing of fans and other system components. In one embodiment, the fans 172 are operated at a minimum speed to avoid freeze up, and are operated at a maximum speed when the temperature of the control circuit 136 reaches ninety degrees (90°) Fahrenheit.

In one embodiment, most of the control circuit 136 may be housed in a remote location such as in a store or a quick service restaurant, and only the power components, fans, fiber converter, and the media player are positioned within the column. In other embodiments, different combinations of components may be included in the control circuit. For example, in some embodiments, the industrial PC(s) may be eliminated and information is sent directly to the monitors or large format displays. In some embodiments, the industrial PC(s) may be replaced with another controller, computing device, or processing circuit, as desired. In still other embodiments, various components of the control circuit may be housed in either the large format display or the support structure. The flexibility of the system allows for installation at a variety of locations with different demands. In some locations, the system may require other components not discussed herein that may be housed in the large format display or the support structure.

The column is arranged such that a positive pressure is maintained within the column such that particulate and moisture migration into the column is minimized. Additionally, the gussets and vents are arranged such that in the event of water migration (e.g., during an extreme weather event) the moisture will evaporate in an acceptable time frame to still meet IP56 standards for weatherproofing.

The above embodiments provide a number of advantages including the ability to provide a single column or support structure that houses control components and allows for simple and effective adjustment of the display layout and configuration. For example, the same column may be used for a single wide, a double wide, and the three wide display, as shown in FIGS. 1-15 discussed above. Additionally, the column may be easily adjusted to support other layouts including landscape type displays and more than one row of displays. For example, a 2×2 display layout could easily be achieved using the same column as might be used for a 1×1 layout. This provides a great amount of flexibility and cost savings when implemented. For example, a user of the display system may easily upgrading a single wide display to a three wide display without significant work and reconfiguration.

FIGS. 18-25 illustrate an embodiment of an ornamental design of a display board system or display system. Other embodiments of ornamental designs of display systems include embodiments similar to FIGS. 18-25 with two display panels or large format displays as in FIGS. 6-10, with three display panels or large format displays as in FIGS. 11-15, and the support column on its own.

The construction and arrangements of the display system, as shown in the various exemplary embodiments, are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Some elements shown as integrally formed may be constructed of multiple parts or elements, the position of elements may be reversed or other varied, and the nature or number of discrete elements or positions may be altered or varied. The order or sequence of any process, logical algorithm, or method steps may be varied or re-sequenced according to alternative embodiments. Other substitutions, modifications, changes and omissions may also be made in the design, operating conditions and arrangement of the various exemplary embodiments without departing from the scope of the present invention.

What is claimed is:

1. A display system comprising: an upright housing meeting IP56 weatherproofing standards and including a first vent and a second vent positioned vertically above the first vent; a mounting arm coupled to the upright housing; an industrial PC mounted within the upright housing between the first vent and the second vent; a fan mounted within the upright housing adjacent the first vent; a thermostat mounted within the upright housing and controlling the fan continuously at or above a non-zero minimum speed so that a positive pressure is maintained within the upright housing between the first vent and the second vent; and a large format display mounted to the mounting arm and receiving signals from the industrial PC; and further comprising a plurality of gusset plates mounted within the upright housing between the first vent and the second vent.

2. The display system of claim 1, wherein the industrial PC is mounted vertically above the fan.

3. The display system of claim 1, further comprising a second industrial PC mounted within the upright housing between the first vent and the second vent; and a second large format display coupled to the mounting arm and receiving signals from the second industrial PC.

4. The display system of claim 3, further comprising a third industrial PC mounted within the upright housing between the first vent and the second vent; and a third large format display coupled to the mounting arm and receiving signals from the third industrial PC.

5. The display system of claim 1, wherein the thermostat controls the fan at the non-zero minimum speed when an ambient temperature is below about forty degrees Fahrenheit and at a maximum speed when the ambient temperature is above about ninety degrees Fahrenheit.

6. The display system of claim 1, wherein the thermostat is pulse-width-modulated.

7. A display system comprising: an upright housing meeting IP56 weatherproofing standards and including a first vent for intake and a second vent for exhaust: said second vent is formed and arranged on said housing vertically above said first vent: a mounting arm coupled to the upright housing; a controller mounted within the upright housing above the vent; a continuously operational fan mounted within the upright housing adjacent the vent; and a large format display mounted to the mounting arm and receiving signals from the controller; and further comprising a plurality of gusset plates mounted within the upright housing above one of the plurality of vents.

8. The display system of claim 7, wherein the fan operates between a minimum speed and a maximum speed to maintain a positive air pressure within the upright housing.

9. The display system of claim 7, further comprising a thermostat that controls the fan at a non-zero minimum speed when an ambient temperature is below about forty degrees Fahrenheit and at a maximum speed when the ambient temperature is above about ninety degrees Fahrenheit.

10. The display system of claim 7, further comprising a second controller mounted within the upright housing above the vent; and a second large format display coupled to the mounting arm and receiving signals from the second controller.

11. The display system of claim 7, further comprising a third controller mounted within the upright housing above the vent; and a third large format display coupled to the mounting arm and receiving signals from the third controller.

12. The display system of claim 7, further comprising a router providing communication between a remote network and the controller.

13. A display system comprising: a housing configured to support one or more large format displays; said housing being sealed so as to be weather resistant and including a first vent for intake and a second vent for exhaust: said second vent is is formed and arranged on said housing vertically above said first vent: a controller mounted within the housing and configured to send display signals to the one or more large format displays; and a fan mounted within the housing and positioned vertically below the controller, the fan operating continuously at or above a non-zero minimum speed to maintain a positive pressure within the housing; and further comprising a gusset plate mounted within the housing between the controller and the fan.

14. The display system of claim 13, wherein the housing includes a vent positioned below the controller.

15. The display system of claim 13, further comprising a speaker mounted within the housing and receiving audio signals from the controller.

16. The display system of claim 13, further comprising a router providing communication between a remote network and the controller.

17. The display system of claim 13, further comprising a thermostat that controls the fan at the non-zero minimum speed when an ambient temperature is below about forty degrees Fahrenheit and at a maximum speed when the ambient temperature is above about ninety degrees Fahrenheit.

\* \* \* \* \*